May 10, 1960 J. MEES, JR 2,936,383
TRANSISTOR BLOCKING OSCILLATOR
Filed Oct. 23, 1956
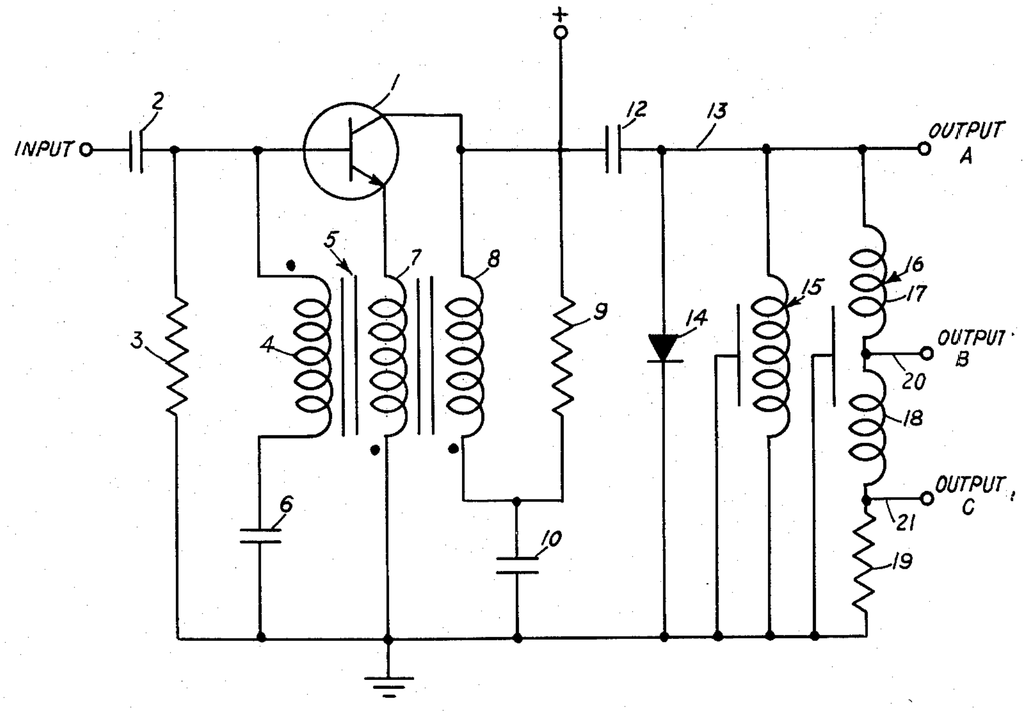
INVENTOR.
JOSEPH MEES, JR.
BY [signature]
ATTORNEYS United States Patent Office 2,936,383

Patented May 10, 1960

2,936,383

TRANSISTOR BLOCKING OSCILLATOR

Joseph Mees, Jr., Swampscott, Mass., assignor to the United States of America as represented by the Secretary of the Navy Application October 23, 1956, Serial No. 617,893
6 Claims. (Cl. 307—88.5)

(Granted under Title 35, U.S. Code (1952), sec. 266)

The invention described herein may be manufactured and used by or for the Government of the United States of America for governmental purposes without the payment of any royalties thereon or therefor.

This invention relates to blocking oscillators and more particularly to transistor blocking oscillators for use in producing delayed output signals in direct correspondence with triggering pulses.

Vacuum tube type blocking oscillator circuits are well known in the arts and have been very successful and satisfactory in producing various types of oscillation outputs. Probably the primary disadvantages of the well known vacuum tube type blocking oscillator circuits are that they require considerable space to accommodate at least one vacuum tube and that they are reliable only to the extent of the reliability of the vacuum tube. Such vacuum tube oscillator circuits also require considerable current from a supply source to provide heater voltage for the vacuum tube, much of which is dissipated in heat.

In the present invention a very small, compact oscillator circuit can be arranged by utilizing a single transistor which is more reliable than a vacuum tube and does not have heat losses. Such an oscillator circuit using a transistor becomes operative immediately upon the initial supply of voltage and triggering pulses thereto. It is therefore a general object of this invention to provide a transistor oscillator circuit which is compact and reliable to produce one or more output signals in delayed sequence.

These and other objects, advantages, features, and uses may become more apparent as the description proceeds when taken in consideration with the single figure of the accompanying drawing showing a schematic circuit diagram illustrating the invention.

Referring more particularly to the drawing, a single transistor 1 has its base coupled through a direct current (D.-C.) blocking capacitor 2 to a triggering pulse source shown therein as the input. The base of transistor 1 is also coupled to ground through a resistor 3 which resistor is in parallel to one winding 4 of a transformer 5 and a capacitor 6, the winding 4 and capacitor 6 being in series. The emitter of transistor 1 is coupled through a second winding 7 of the transformer 5 to ground. The collector of transistor 1 is coupled through a third winding 8 of transformer 5 and a resistor 9 in series to a positive D.-C. voltage source. The junction of the winding 8 and the resistor 9 is coupled to ground through a capacitor 10. The transformer 5 is poled, as shown by the dots at the end of the transformer windings.

The collector of transistor 1 is also coupled to an output circuit through a D.-C. blocking capacitor 12 by the conductor 13. The conductor 13 is coupled to ground through a diode 14 which is in parallel to a shorted delay line 15. A second delay line 16 couples across the conductor 13 to ground through two delay line sections 17 and 18 and a resistor 19 in series. The first oscillation output A is taken from conductor 13, a second output B is taken from conductor 20 coupled to the juncture of delay line sections 17 and 18, and a third output C is taken from the juncture of the delay line section 18 and the resistor 19.

In the operation of the transistor oscillator circuit let it be assumed for the purpose of example that the oscillator is used to provide at least three output signals in consecutive order to operate early and late gating circuits. Let it further be assumed purely for the purpose of example that it is desirable to have oscillator output pulses of .5 microsecond and that the transistor is biased to become conductive when an input signal of .5 volt is impressed on the base thereof.

Initially, the transistor oscillator circuit is nonconductive or in a quiescent state when no input triggering pulse is impressed on the input since the emitter and base are of the same potential. When a triggering pulse of a magnitude exceeding .5 volt is impressed at the input it will pass through the D.-C. blocking capacitor 2 and be impressed on the base of transistor 1. This produces a conduction through the emitter and collector which results in a feedback to the base by virtue of the transformer 5 to cause maximum conduction of the transistor 1 within about .1 microsecond. The emitter current is limited by the resistor 9 to prevent overconduction of the collector which could otherwise be damaging to the transistor 1. The capacitor 10 is used for decoupling in order that output pulse amplitude will not be reduced by resistor 9. The switching of the transistor from zero to maximum conduction causes the collector voltage to be a negative step function in this illustration and example. The shorted delay line 15 reflects this negative step function as a positive step function delayed by twice the delay of the delay line 15. If an output pulse of .5 microsecond is desired, the delay built into the delay line 15 should be .25 microsecond. The positive and negative step functions add at the output A to produce a .5 microsecond negative output pulse which may be used for an early gating circuit, if desired. The outputs B and C may be delayed in time by the circuit constants arranged by the delay line segments 17 and 18 for use in late gating circuits, as desired. The R-C time constant of resistor 3 and capacitor 6 is made long enough so that the oscillator is not triggered more than once for each input trigger pulse when the output pulse is shorter in time duration than the input pulse. When no delay line is used, the blocking oscillator output pulse will be terminated when the core of transformer 5 saturates. Any positive swing in the output voltage will be clipped off by the diode 14 conducting this positive swing directly to ground, in the illustration shown by the drawing. Negative swings could likewise be clipped where the circuit is arranged to produce positive output pulses. Other oscillations may be completed in like manner by having the transistor triggered by triggering pulses impressed on the input through the D.-C. blocking capacitor 2, as hereinbefore described, since only one output pulse is generated for each triggering pulse. While a delay line 16 is shown in combination with the oscillator circuit to illustrate the capabilities of this circuit to produce a plurality of consecutive pulses for gating circuits or the like, it is to be understood that the oscillator circuit may have more than three delay output circuits or it may have only one to produce a single output circuit A as shown.

Although the transistor 1 has been illustrated for the purpose of the invention herein as being of the N–P–N type, it is to be understood that a P–N–P type transistor may likewise be used as may well be understood by circuit modification. It may be realized that by using a P–N–P type transistor and reversing supply polarities, as is well recognized in the art, positive pulse oscillations may be produced and this obvious modification is within the contemplation of this invention. Further, although the invention as illustrated herein was shown to be operative by specific example for early and late gating circuits, it is to be understood that it may be well adapted to other uses by changing circuit constants to change voltage output amplitude, pulse width, et cetera, as other applications may require.

While many modifications and changes may be made in the construction and arrangement of the combination illustrated to provide oscillations from a transistor blocking oscillator circuit, it is to be understood that I desire to be limited only by the scope of the appended claims.

I claim:

1. A transistor blocking oscillator circuit comprising: a transistor having a base electrode, an emitter electrode, and a collector electrode, said base adapted to receive triggering pulses for producing conduction pulses on the output of said transistor; a feedback circuit inductively coupling said base with said collector and emitter for producing immediate peak conduction pulses upon receiving triggering pulses on said base; an output circuit coupled to one of said electrodes other than said base electrode; means limiting the current through the transistor to a safe value; means coupled to said output circuit for clipping overswing from the transistor output conduction pulses; and delay line means having a plurality of output taps coupled to said output circuit for producing a plurality of pulses delayed in time from said conduction pulses of said transistor whereby gating pulses of predetermined delay times are produced.

2. A transistor blocking oscillator circuit comprising; a transistor having a base element, an emitter element, and a collector element, said base element adapted to receive triggering pulses for triggering the oscillations of the transistor and one of the other elements being connectible to an output circuit; a feedback network to said base element inductively coupled to said emitter and collector elements for producing peak conduction immediately upon receipt of each triggering pulse; means limiting the current through the transistor elements; means coupled to said base element for preventing the conduction period of the transistor from being established more than once for each triggering pulse; means coupled in the connection to the output circuit for clipping overswing pulse portions of oscillations produced by the transistor; and a multi-output delay line means coupled to said one of the other elements for producing a plurality of delayed pulses with respect to the output of said output circuit from a single oscillation pulse emanating from said one of the other elements whereby a plurality of devices in the output circuit may be operated in a predetermined sequence.

3. A transistor blocking oscillator circuit as set forth in claim 2 wherein said feedback network includes a transformer, the base element and the other of the other elements each being coupled through a winding thereof to ground, and said one of said other elements being coupled through a winding thereof to a voltage source for providing said electromagnetic coupling.

4. A transistor blocking oscillator circuit as set forth in claim 2 wherein said means limiting the current through the transistor elements is a current limiting resistor in a coupling of said one of the other elements to a voltage source, said means coupled to said base element for preventing the conduction period is a resistor-capacitor combination, and said means coupled in the connection to the output circuit for clipping positive pulses is a diode connected to ground.

5. A transistor blocking oscillator circuit comprising; a transistor having a base element, an emitter element, and a collector element, said base element coupled through a capacitor element for connection to an input triggering signal source, one of said other elements coupled through a capacitor to an output circuit, and the other of said other elements being coupled through a first winding of a transformer to ground potential; a voltage source coupled through a current limiting resistor and a second winding of said transformer in series to said one of said other elments; a third winding of said transformer and a capacitor coupled in series between said base element and ground potential; a resistor coupled in parallel to said third winding of said transformer and said capacitor in series for limiting, by cooperation with said capacitor, each oscillation of said transistor to one each input triggering signal; a diode coupled between said one of said other elements and ground potential for clipping overswing portions from each oscillation pulse; shorted delay line means coupled in parallel to said diode for limiting each oscillation pulse in time duration; and a multi-output delay line means coupled in parallel to said diode and said shorted delay line means for producing a plurality of delayed pulses with respect to the output of said output circuit from each oscillation pulse generated.

6. A transistor blocking oscillator circuit comprising; a transistor having an emitter, a collector, and a base with the base thereof coupled through a capacitor for connection to an input triggering signal source, the collector thereof coupled through a capacitor to an output circuit, and the emitter thereof coupled through a first transformer winding to ground potential; a collector voltage source coupled through a resistor and a second winding of said transformer in series; a third winding of said transformer and a capacitor coupled between said base and a fixed potential; a resistor coupled in parallel to said third transformer winding and said capacitor to cooperate with said capacitor to limit the conduction period of each transistor oscillation to one each input triggering signal; a diode coupled between said collector and said fixed potential for clipping overswing portions from each oscillation pulse; shorted delay line means coupled between said collector and said fixed potential for limiting the conduction period of said transistor in time duration; and multi-output delay line means coupled to said output circuit for producing a plurality of delayed pulses with respect to the output of said output circuit from each oscillation pulse generated in the transistor circuit.

References Cited in the file of this patent

UNITED STATES PATENTS

| | | |
|---|---|---|
| 2,469,977 | Morrison | May 10, 1949 |
| 2,485,101 | Lindahl | Oct. 18, 1949 |
| 2,544,213 | Bennett et al. | Mar. 6, 1951 |
| 2,586,310 | Dill | Feb. 19, 1952 |
| 2,612,620 | Winter | Sept. 30, 1952 |
| 2,690,510 | Forbes | Sept. 28, 1954 |
| 2,757,287 | Stanley | July 31, 1956 |
| 2,758,208 | Grayson | Aug. 7, 1956 |
| 2,850,648 | Elliott | Sept. 2, 1958 |
| 2,857,518 | Reed | Oct. 21, 1958 |

OTHER REFERENCES

Publication: "Electronics," pp. 132, 133.